United States Patent [19]
Tamura

[11] Patent Number: 5,982,794
[45] Date of Patent: Nov. 9, 1999

[54] EXTERNAL RESONATOR TYPE OF VARIABLE-WAVELENGTH SEMICONDUCTOR LASER LIGHT SOURCE

[75] Inventor: Toshimasa Tamura, Tokyo, Japan

[73] Assignee: Ando Electric Co., Ltd., Tokyo, Japan

[21] Appl. No.: 08/992,717

[22] Filed: Dec. 17, 1997

[30] Foreign Application Priority Data

Dec. 18, 1996 [JP] Japan .................................. 8-338523

[51] Int. Cl.⁶ ........................................................ H01S 3/00
[52] U.S. Cl. ................................ 372/38; 372/32; 372/34; 372/36; 372/49; 372/98; 372/102
[58] Field of Search .................................. 372/20, 22, 23, 372/28, 32, 33, 34, 36, 38, 43, 50, 92, 98, 99, 49, 102

[56] References Cited

U.S. PATENT DOCUMENTS

| | | | |
|---|---|---|---|
| 4,908,829 | 3/1990 | Kruglii et al. | 372/29 |
| 5,042,042 | 8/1991 | Hori et al. | 372/32 |
| 5,287,367 | 2/1994 | Yanagawa | 372/31 |
| 5,414,727 | 5/1995 | Berndt et al. | 372/38 |
| 5,467,363 | 11/1995 | Okabayashi | 372/38 |
| 5,491,714 | 2/1996 | Kitamura | 372/92 |
| 5,493,575 | 2/1996 | Kitamura | 372/20 |
| 5,521,738 | 5/1996 | Froberg et al. | 372/38 X |
| 5,579,327 | 11/1996 | Ohtateme et al. | 372/20 |
| 5,604,758 | 2/1997 | AuYeung et al. | 372/34 |
| 5,706,301 | 1/1998 | Lagerstrom | 372/32 |
| 5,844,928 | 12/1998 | Shastri et al. | 372/38 |
| 5,867,513 | 2/1999 | Sato | 372/32 |
| 5,889,803 | 3/1999 | Pfeiffer et al. | 372/34 |

FOREIGN PATENT DOCUMENTS

| | | | |
|---|---|---|---|
| 0 529 731 | 3/1993 | European Pat. Off. | 372/20 X |
| 0 618 653 | 10/1994 | European Pat. Off. | 372/20 X |

OTHER PUBLICATIONS

Patent Abstracts of Japan, vol. 095, No. 008, Sep. 29, 1995 & JP 07 131103 A (Laser Noshuku Gijutsu Kenkyu Kumiai; Others: 01), May 19, 1995, 1 page.

*Primary Examiner*—Brian Healy
*Attorney, Agent, or Firm*—Pillsbury Madison & Sutro, LLP

[57] ABSTRACT

An external resonator type variable-wavelength LD light source which can compensate errors of a change in an oscillation wavelength caused by a change in an LD driving current, a change in the oscillation wavelength caused by a change in a temperature of an entire light source unit, a difference between set and actual wavelengths caused by mechanical factors to thereby ensure a wavelength reproducibility of 0.001 nm even when the LD driving current or operational temperature varies. The light source includes a light source unit temperature detection member for detecting a temperature of an entire semiconductor laser light source unit; a storage unit for storing therein oscillation wavelength changes of the semiconductor laser light source unit on the basis of a change in a driving current to the semiconductor laser, of a change in the temperature of the entire semiconductor laser light source unit detected by the light source unit temperature detection member, and of a change in an encoder output value measured by an encoder; and a wavelength change compensation member for compensating a change of the oscillation wavelength of the semiconductor laser light source unit on the basis of the oscillation wavelength changes stored in the storage unit.

5 Claims, 11 Drawing Sheets

| λSET  | S   | λM  |
|-------|-----|-----|
| λSET0 | S0  | λM0 |
| λSET1 | S1  | λM1 |
| λSET2 | S2  | λM2 |
| ⋮     | ⋮   | ⋮   |

FIG.5

| $\Delta \lambda_M (n_{LD})$ | $\Delta T_{LD}$ |
|---|---|
| $\Delta \lambda_{M0} (n_{LD})$ | $\Delta T_{LD0}$ |
| $\Delta \lambda_{M1} (n_{LD})$ | $\Delta T_{LD1}$ |
| $\Delta \lambda_{M2} (n_{LD})$ | $\Delta T_{LD2}$ |
| ⋮ | ⋮ |

| $\Delta\lambda_M(L_{PZT})$ | $\Delta L_{PZT}$ |
|---|---|
| $\Delta\lambda_{M0}(L_{PZT})$ | $\Delta L_{PZT0}$ |
| $\Delta\lambda_{M1}(L_{PZT})$ | $\Delta L_{PZT1}$ |
| $\Delta\lambda_{M2}(L_{PZT})$ | $\Delta L_{PZT2}$ |
| ⋮ | ⋮ |

EXTERNAL RESONATOR TYPE OF VARIABLE-WAVELENGTH SEMICONDUCTOR LASER LIGHT SOURCE

BACKGROUND OF THE INVENTION

1. Field of the Invention

The present invention relates to an external resonator type of a variable-wavelength semiconductor laser light source for use in coherent light communication/measurement technique fields.

2. Description of the Related Art

In coherent light communication/measurement techniques, a semiconductor laser (referred to as the LD, hereinafter) light source of a single mode oscillation type which can change its wavelength in a wide range and have a narrow spectral line width and a good set-wavelength accuracy has been demanded.

In specifications of such a light source, there has been demanded in the market a light source which can have a variable width of 100 nm, a wavelength setting resolution of 0.001 nm and a wave reproducibility of 0.001 nm and also which can be operated with a constant light output.

Such LD light sources of the single mode oscillation type capable of changing the wavelength in a wide rage as mentioned above generally include an LD light source of an external resonator type which uses a diffraction grating.

The operation of oscillation wavelength of an external resonator type of LD light source using a diffraction grating will be explained briefly, as follows.

The oscillation wavelength of the LD light source is given by the following relational equations (1) and (2). The light from the LD light source oscillates with a resonating wavelength $\lambda_M$ which is in the vicinity of the Bragg wavelength $\lambda_b$ leading to a small mirror loss.

$$\lambda_M = 2 \times n \times L / M \quad (1)$$

$$\lambda_b = 2 \times d \times \sin(\theta)/m \quad (2)$$

where $\lambda_m$ is the resonance wavelength in the external resonator,

M is the longitudinal mode (integer) in the external resonator,

L is the length of the external resonator, n is the refractive index of the external resonator, $\lambda_b$ is a Bragg wavelength, d is a spacing between grooves in the diffraction grating (grating constant), θ is an incident angle to the diffraction grating (Littrow mounting), and m is an order of reflected light of diffraction grating (usually, m=1)

Therefore, in an LD light source using a diffraction grating, the resonance wavelength $\lambda_M$ can be changed by changing the Bragg wavelength $\lambda_b$ to vary M. That is, the wavelength can be changed in a wide range by changing the incident angle θ to the diffraction grating with allowing mode hop. In order to change the wavelength successively without causing mode hop, the length of the external resonator L may be changed so that the longitudinal mode M is always constant corresponding to the incident angle θ to the diffraction grating. For example, a sine bar mechanism is adopted for this purpose. The principle thereof will be explained briefly with reference to FIG. 9, as follows.

In FIG. 9, an LD 1 and a diffraction grating 2 form a Fabry-Peŕrot resonator. The resonance wavelength $\lambda_M$ thereof in the equation (1) is expressed as follows.

$$\lambda_M = 2 \times n \times L / M \quad (3)$$
$$= 2 \times L_A \times \sin(\theta)/M$$

where $L_A$ is the length of an arm (sine bar).

Accordingly, the difference between the wavelengths $\lambda_M$ and $\lambda_b$ is as follows.

$$\lambda_M - \lambda_b = 2 \times \sin(\theta) \times \{(L_A/M) - (d/m)\} \quad (4)$$

Therefore, when the light source is designed to satisfy a condition $(L_A/M) = (d/m)$, the wavelength shift can be set at zero regardless of the rotational angle 2 of the diffraction grating 2.

Thus, the wavelength can be continuously changed without the mode hop.

FIG. 10 is an exemplary arrangement of a prior art external resonator type variable-wavelength LD light source.

First, an LD unit 4 includes, as shown in FIG. 11, a Fabry-Peŕrot type LD 1 coated on its one end face with an anti-reflection film (referred to as the AR coating, hereinafter) 1a, lenses 5 and 6, and an optical isolator 7. Further mounted to the LD unit 4 are a temperature detecting element 8 and a Peltier element 9, both of which are controlled with respect to temperature by a temperature adjustment circuit (referred to as the ATC circuit, hereinafter) 10.

In the illustrated example, light going from an end face side of the AR coating 1a of the LD 1 is changed by the lens 5 to parallel or collimated light. The lens 5 comprises preferably a non-spherical lens or a combined or composite lens having a small liquid-level aberration.

An LD end face 1b not having the AR coating 1a applied thereon as well as the diffraction grating 2 as an external reflecting mirror form an external resonator.

The diffraction grating 2 is mounted to a rotary mechanism 11 and to one end of an arm (sine bar) 3, and the arm 3 abuts at the other end against an end face of a parallel moving mechanism 12.

The parallel moving mechanism 12, which has the LD unit 4 fixedly mounted thereto, is arranged to be moved in parallel with directions shown by arrows X. Provided in the vicinity of the parallel moving mechanism 12 is a switch 13 as a position detecting means.

A motor unit 14 as a driver unit includes a motor and an encoder, the motor being driven according to a pulse signal received from a control unit 15.

The aforementioned LD unit 4, diffraction grating 2, rotary mechanism 11, arm 3, parallel moving mechanism 12, switch 13 and motor unit 14 are mounted on an optical system base 16.

The LD 1 is driven by an LD driving current $I_{LD}$ received from an LD driver circuit 17.

A beam splitter 18 is an optical device which acts to pass therethrough part of output light $P_O$ emitted from a variable-wavelength LD light source unit 19 as output light $P_{O1}$ and to reflect part of the remaining output light $P_O$ as output light $P_{O2}$. Further, a PD unit 20 receives the reflected light $P_{O2}$, converts it to a voltage value $V(P_{O2})$, and outputs the voltage value to the LD driver circuit 17.

Since the voltage value $V(P_{O2})$ received from the PD unit 20 is fed back to the LD driver circuit 17 to control the LD driving current $I_{LD}$, constant light output operation can be realized. When the constant light output operation is not carried out, on the contrary, it is also possible to control the LD driving current $I_{LD}$ with use of a signal $I_{SET}$ received from the control unit 15.

Explanation will next be made as to how to set wavelength in FIG. 10.

First, when power is supplied to the respective sections of the system, a pulse signal generated from the control unit 15 so that the motor of the motor unit 14 is driven to move the parallel moving mechanism 12 in parallel and to rotate the rotary mechanism 11 through the arm 3.

When the parallel moving mechanism 12 reaches a certain position, the switch 13 is turned ON. The position at which the switch 13 is turned ON, is assumed to be an origin position. When the switch 13 is turned ON, the switch outputs an origin detecting signal $S_G$. The control unit 15, when recognizing the origin detecting signal $S_G$, stops the output of the pulse signal to stop the motor. At the same time, the controller outputs a reset signal $R_e$ to reset the encoder of the motor unit 14. The then oscillation wavelength is measured by a wavelength meter and a measured value $\lambda_O$ is assumed to be an origin wavelength $\lambda_O$.

After this, the wavelength $\lambda_O$ is set at the origin position.

When the wavelength is varied, it is relatively changed with the respect to $\lambda_O$ as a reference.

That is, the control unit 15 calculates a difference between a set wavelength $\lambda_{SET}$ (referred to as the set wavelength, hereinafter) and the origin wavelength $\lambda_O$, and outputs to the motor of the motor unit 14 a pulse for causing the parallel moving mechanism 12 to be moved to a position corresponding to the set wavelength $\lambda_{SET}$. Further, the encoder of the motor unit 14 outputs always to the control unit 15 a signal S indicative of the movement amount of the parallel moving mechanism 12 moved by the motor, and the control unit 15 can recognize the current set wavelength based on the signal S.

In FIG. 10, the aforementioned sine bar mechanism is employed so that the parallel movement of the parallel moving mechanism 12 in the arrow X direction causes change of the rotational angle 2 of the diffraction grating 2 and at the same time, as seen from the above equation (3), adjustment of the external resonator length L in response to a change in 2 realizes continuous variable wavelength without mode hop.

In the prior art external resonator type variable-wavelength LD light source, however, the oscillation wavelength varies due to the following reasons and thus the wavelength reproducibility is deteriorated.

In this connection, an error $\Delta\lambda_{MA}$ is expressed as follows.

$$\Delta\lambda_{MA}=\Delta\lambda_M(T_O)+\Delta\lambda_M(I_{LD})+\Delta\lambda_M(S) \quad (5)$$

where, $\Delta\lambda_M(T_O)$ is a change in the oscillation wavelength caused by thermal expansion involved by a temperature change in the entire light source unit, $\Delta\lambda_M(I_{LD})$ is a change in the oscillation wavelength caused by a change in the LD driving current, and $\Delta\lambda_M(S)$ is a shift of an actual oscillation wavelength from the set wavelength (encoder output value), caused by mechanical factors.

First one of the error causes is expressed by $\Delta\lambda_M(T_O)$. In the prior art variable-wavelength LD light source, the wavelength accuracy and wavelength reproducibility are guaranteed only at a constant temperature (e.g., 25° C.), so that the thermal expansion and refractive index change caused by the temperature change of the entire light source unit cause change of "n" and "L" in the afore-mentioned equation (1), thus changing the oscillation wavelength $\lambda_M$.

Assuming that a change in the external resonator length is denoted by $\Delta(n \times L)$, then $\Delta\lambda_M(T_O)$ is expressed, as follows, from the afore-mentioned equation (1).

$$\Delta\lambda_M(T_O)=(\lambda_M/(n \times L)) \times \Delta(n \times L) \quad (6)$$

In this case, in the variable-wavelength LD light source unit 19 shown in FIG. 10, mechanical parts are made of mainly invar material having a low thermal expansion coefficient, but the motor of the motor unit 14, diffraction grating 2, lenses 5 and 6, LD 1, etc. are made of stainless steel, glass, quartz, etc. respectively.

In case that the thermal expansion coefficient of the external resonator including its refractive index change is about $5 \times 10^{-6}$ and "n×L" in the above equation (1) is 30 mm when the variable-wavelength LD light source unit 19 is designed by using the above-described mechanical parts, "n×L" varies with a rate of 0.15 $\mu$m/°C.

When the light source is used at a temperature in the range of 25±5° C., $\Delta(n \times L) \approx 1.5$ $\mu$m. Hence, if $\lambda_M$=1550 nm, then the wavelength varies by $\Delta\lambda_M(T_O)$=0.07 nm in accordance with the afore-mentioned equation (6).

Second one of the error causes comes from $\Delta\lambda_M(I_{LD})$ in the afore-mentioned equation (5), which results from a change in the LD driving current.

Assuming now that a rate of change of oscillation wavelength to the change of the LD driving current is denoted by $d\lambda_M/dI_{LD}$ and a change in the LD driving current is denoted by $\Delta I_{LD}$, then $\Delta\lambda_M(I_{LD})$ is written as follows.

$$\Delta\lambda_M(I_{LD})=(d\lambda_M/dI_{LD}) \times \Delta I_{LD} \quad (7)$$

As a specific value for the rate of change of the oscillation wavelength to the LD driving current change, for example, $d\lambda_M/dI_{LD}$ was about 2 pm/mA as an actually measured value of a DFB single laser.

The afore-mentioned equation (1) is rewritten with use of parameters in FIG. 12, as follows.

$$\lambda_M=2 \times (n_O \times L_O + n_{LD} \times L_{LD})/M \quad (8)$$

where $n_O$ is the refractive index (=1) of air, $n_{LD}$ is the refractive index of the LD, $L_O$ is "L-$L_{LD}$" in FIG. 12, and $L_{LD}$ is the physical length of the LD.

In the case where $d\lambda_M/dI_{LD}$ for the above single laser is considered as the external resonator type LD light source, if $L_{LD}$=300 $\mu$m, $n_{LD}$=3.54, L=30 mm, $n_O$=1 and $\lambda_M$=1550 nm, then $d\lambda_M/dI_{LD} \approx 0.07$ pm/mA in accordance with the above equations (1) and (8).

Assume now that the LD driving current is constant and the oscillation wavelength was changed by 100 nm. Then an optical output $P_0$ is changed by about 1 mW from 4 mW as shown in FIG. 13 due to, e.g., wavelength.

In order to make the optical output constant, it is necessary to change the LD driving current as shown in FIG. 14. A relationship between $P_0$ and $I_{LD}$ is as shown in FIG. 15, that is:

$$\Delta P_0/\Delta I_{LD} \approx 0.1 \text{ mW/mA} \quad (9)$$

Where $\Delta P_0$ denotes an optical output change. Since $\Delta P_0 \approx =3$ mW, $\Delta I_{LD} \approx 30$ mA.

Hence the wavelength is changed by $\Delta I_{LD}(I_{LD}) \approx 2$ pm in accordance with the above equation (7).

Third one of the error causes is $\Delta\lambda_M(S)$ in the above equation (5), which is generated, in such an arrangement as shown in FIG. 10, by mechanical factors when the parallel moving mechanism 12 and rotary mechanism 1 are finely moved by the motor of the motor unit 14 to change the oscillation wavelength.

Theoretically, as shown by a dotted line in FIG. 16, the set wavelength $\lambda_{SET}$ corresponding to the output value of the encoder of the motor unit 14 and its actual oscillation wavelength vary proportionally in a 1:1 relationship; but they actually vary as shown by a solid line in FIG. 16.

The above-described 3 errors cause deterioration of the wavelength reproducibility. When the deterioration of the wavelength accuracy is taken into account, it becomes necessary, in addition to the above 3 errors, to take into consideration the error of $\lambda_O$ corresponding to the origin at the time of turning ON the power supply.

With regard to $\lambda_O$, mechanical factors cause an random error in the external resonator length L in the equation (1).

Assuming now that a change in the external resonator length is denoted by $\Delta L$ and an origin wavelength error is denoted by $\Delta\lambda_O$, then the following equation is satisfied in accordance with the equation (1).

$$\Delta\lambda_O = (\lambda_O/L) \times \Delta L \tag{10}$$

When $\lambda_O$=1550 nm, L=30 mm and the random error $\Delta L$=1 $\mu$m, $\Delta\lambda_O \approx 0.05$ nm in accordance with the equation (10).

In this case, an error of about 0.05 nm takes place for all the oscillation wavelengths $\lambda_M$.

However, this error is not reproducible so that, if compensation is required, then it is necessary to re-measure the origin wavelength $\lambda_O$ each time the power supply is turned ON with use of a wavelength meter.

This may allow compensation of an error in the wavelength accuracy, but this also involves a large-scale light source with high costs, which is not practical.

SUMMARY OF THE INVENTION

The present invention was developed in view of these problems. It is therefore an object of the present invention to provide an external resonator type variable-wavelength LD light source which can issue a constant optical output with a variable LD driving current, can ensure a wavelength reproducibility of 0.001 nm even when the LD driving current or operational temperature varies, can vary its oscillation wavelength continuously, and can be made low in cost and small in size.

In order to solve the above object, in accordance with an aspect of the invention, the external resonator type variable-wavelength LD light source comprises: a light source unit temperature detection member for detecting a temperature of an entire semiconductor laser light source unit; a storage unit for storing therein oscillation wavelength changes of the semiconductor laser light source unit on the basis of a change in a driving current to the semiconductor laser, of a change in the temperature of the entire semiconductor laser light source unit detected by the light source unit temperature detection member, and of a change in an encoder output value measured by an encoder; and a wavelength change compensation member for compensating a change of the oscillation wavelength of the semiconductor laser light source unit on the basis of the oscillation wavelength changes stored in the storage unit.

In this case, the entire light source unit temperature detection member may comprise a temperature detecting element or any device so long as it has a function of detecting the temperature of the entire variable-wavelength LD light source unit.

Further, the storage unit may comprise an ordinary storage unit so long as it can store therein predetermined information. Furthermore, the oscillation wavelength change compensation member may comprise any device having any structure, so long as it has a function of eventually compensating a change in the oscillation wavelength of the variable-wavelength LD light source unit on the basis of the change of the oscillation wavelength stored in the storage unit.

As described above, since the invention is directed to the external resonator type variable-wavelength LD light source for compensating the change of the oscillation wavelength of the variable-wavelength LD light source unit by means of the oscillation wavelength change compensation member on the basis of the change of the oscillation wavelength of the variable-wavelength LD light source unit with respect to the change of the encoder output value; the external resonator type variable-wavelength LD light source can compensate errors of the change in the oscillation wavelength caused by the change in the LD driving current, the change in the oscillation wavelength caused by the change in the temperature of the entire light source unit, a difference between the set and actual wavelengths caused by mechanical factors to thereby ensure a wavelength reproducibility of 0.001 nm even when the LD driving current or operational temperature varies.

In addition, the wavelength can be varied continuously, and the light source can be made low in cost and small in size.

In accordance with another aspect of the present invention, the external resonator type variable-wavelength LD light source comprises: a semiconductor laser unit including a semiconductor laser having a non-reflection film applied on its one end face, a temperature detecting element for measuring a temperature of the semiconductor laser and a Peltier element for changing the temperature of the semiconductor laser; a diffraction grating for forming a resonator together with the other end face of the semiconductor laser of the semiconductor laser unit having the non-reflection film not applied thereon; a sine bar mechanism having the diffraction grating mounted thereto for changing an incident angle of light emitted from the semiconductor laser to the diffraction grating; a parallel moving mechanism having the semiconductor laser unit mounted thereon and provided as contacted with the sine bar; a driver unit having a motor for finely driving the parallel moving mechanism and an encoder for measuring rotation of the motor; a position detecting member for detecting a position of the parallel moving mechanism; a temperature adjustment circuit for controlling a temperature of the semiconductor laser unit; and a semiconductor laser driving circuit for driving the semiconductor laser; a light source unit temperature detection member for detecting a temperature of an entire light source unit, the light source unit including the semiconductor laser unit, diffraction grating, sine bar mechanism, parallel moving mechanism, driver unit, and position detecting member; a storage unit for storing therein oscillation wavelength changes of the semiconductor laser light source unit on the basis of a change in a driving current to the semiconductor laser, of a change in the temperature of the entire semiconductor laser light source unit detected by the light source unit temperature detection member, and of a change in an encoder output value measured by an encoder; and a wavelength change compensation member for compensating a change of the oscillation wavelength of the semiconductor laser light source unit on the basis of the oscillation wavelength changes stored in the storage unit.

The oscillation wavelength change compensation by the oscillation wavelength change compensation member may be carried out by controlling the ATC circuit under control of a controller to thereby change the temperature of the LD unit.

According to the external resonator type variable-wavelength LD light source having such a member, since the oscillation wavelength change compensation member in the LD light source controls the ATC circuit under control of the controller to thereby change the temperature of the LD unit and to compensate the change of the oscillation wavelength of the variable-wavelength LD light source unit, the external resonator type variable-wavelength LD light source can compensate errors of the change in the oscillation wavelength caused by the change in the LD driving current, the change in the oscillation wavelength caused by the change in the temperature of the entire light source unit, and a difference between the set and actual wavelengths caused by mechanical factors to thereby ensure a wavelength reproducibility of, e.g., 0.001 nm even when the LD driving current or operational temperature varies, can vary the wavelength continuously, and can make its costs low and its size small.

The oscillation wavelength change compensation by the oscillation wavelength change compensation member may be carried out by controlling driving of the motor under control of a controller to thereby move the parallel moving mechanism finely.

According to the external resonator type variable-wavelength LD light source having such a member, since the oscillation wavelength change compensation member in the LD light source controls driving of the motor under control of a controller to thereby move the parallel moving mechanism finely and to compensate the change of the oscillation wavelength of the variable-wavelength LD light source unit, the external resonator type variable-wavelength LD light source can compensate errors of the change in the oscillation wavelength caused by the change in the LD driving current, the change in the oscillation wavelength caused by the change in the temperature of the entire light source unit, a difference between the set and actual wavelengths caused by mechanical factors, can ensure a wavelength reproducibility of 0.001 nm even when the LD driving current or operational temperature varies, can vary the wavelength continuously, and can make its costs low and its size small.

Preferably, the external resonator type variable-wavelength semiconductor laser light source further comprises a piezo element (referred to as the PZT, hereinafter) for finely moving the parallel moving mechanism by driving the motor, and in that the oscillation wavelength change compensation member controls driving of the motor under control of the controller to drive the PZT and to move the parallel moving mechanism finely.

According to the external resonator type variable-wavelength LD light source having such a structure, since the LD light source further comprises the PZT for finely moving the parallel moving mechanism by driving the motor, and in that the oscillation wavelength change compensation member controls driving of the motor under control of the controller to drive the PZT and to move the parallel moving mechanism finely to thereby correct the change of the oscillation wavelength of the variable-wavelength LD light source unit, the external resonator type variable-wavelength LD light source can compensate, errors of the change in the oscillation wavelength caused by the change in the LD driving current, the change in the oscillation wavelength caused by the change in the temperature of the entire light source unit, a difference between the set and actual wavelengths caused by mechanical factors, can ensure a wavelength reproducibility of 0.001 nm even when the LD driving current or operational temperature varies, can vary the wavelength continuously, and can make its costs low and its size small.

BRIEF DESCRIPTION OF THE DRAWINGS

The present invention will become more fully understood from the detailed description given hereinbelow and the accompanying drawings which are given by way of illustration only, and thus are not intended as a definition of the limits of the present invention, and wherein;

FIG. 5 is a translation table which is stored in the storage unit in FIG. 4;

PREFERRED EMBODIMENT OF THE INVENTION

Embodiments of the external resonator type variable-wavelength LD light source in accordance with the present invention will be explained with reference to FIGS. 1 to 8.

First Embodiment

Figure 1:
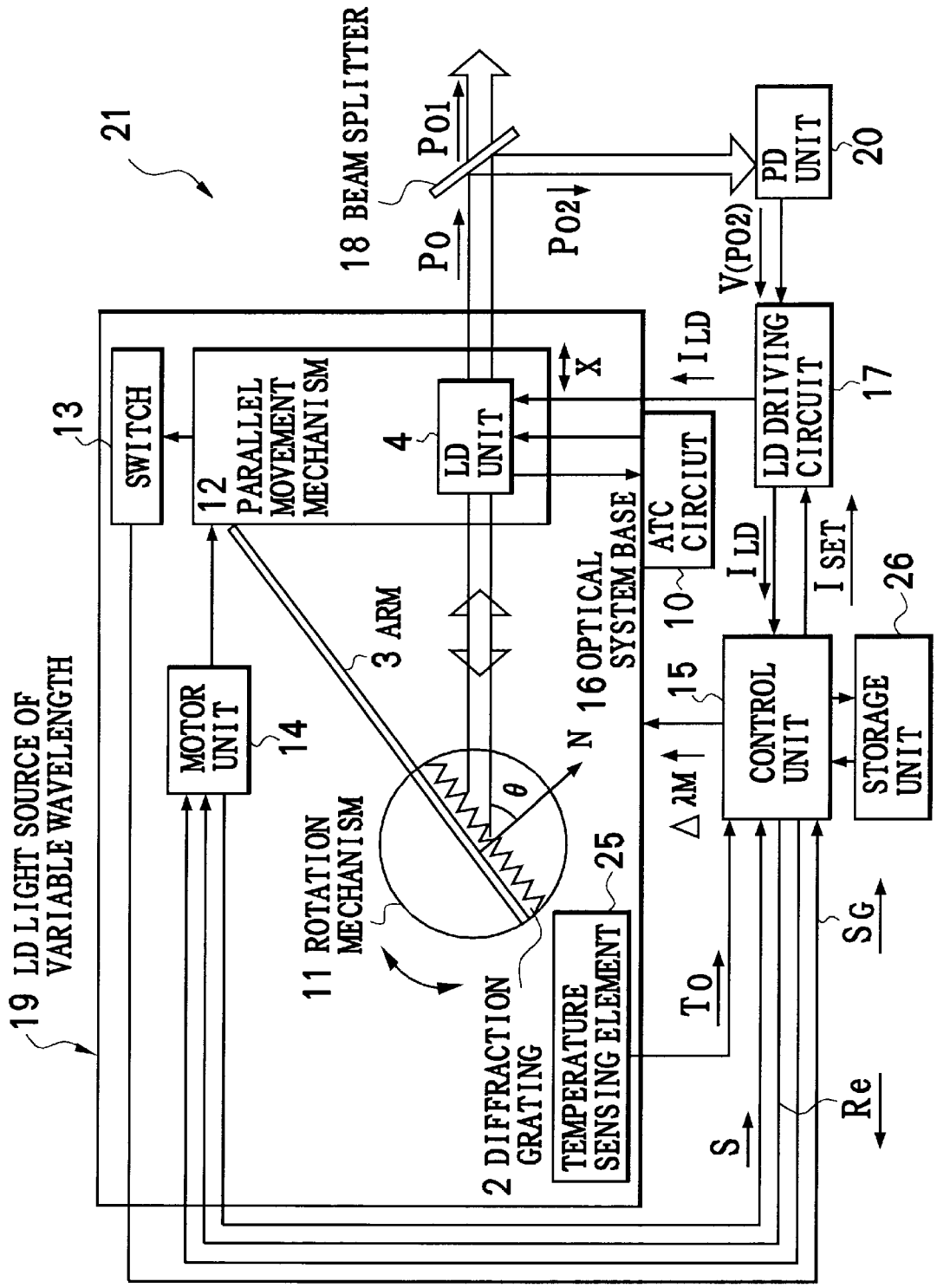
FIG. 1 is a block diagram showing an external resonator type of variable-wavelength LD light source according to a first embodiment of the present invention.
Figure 10:
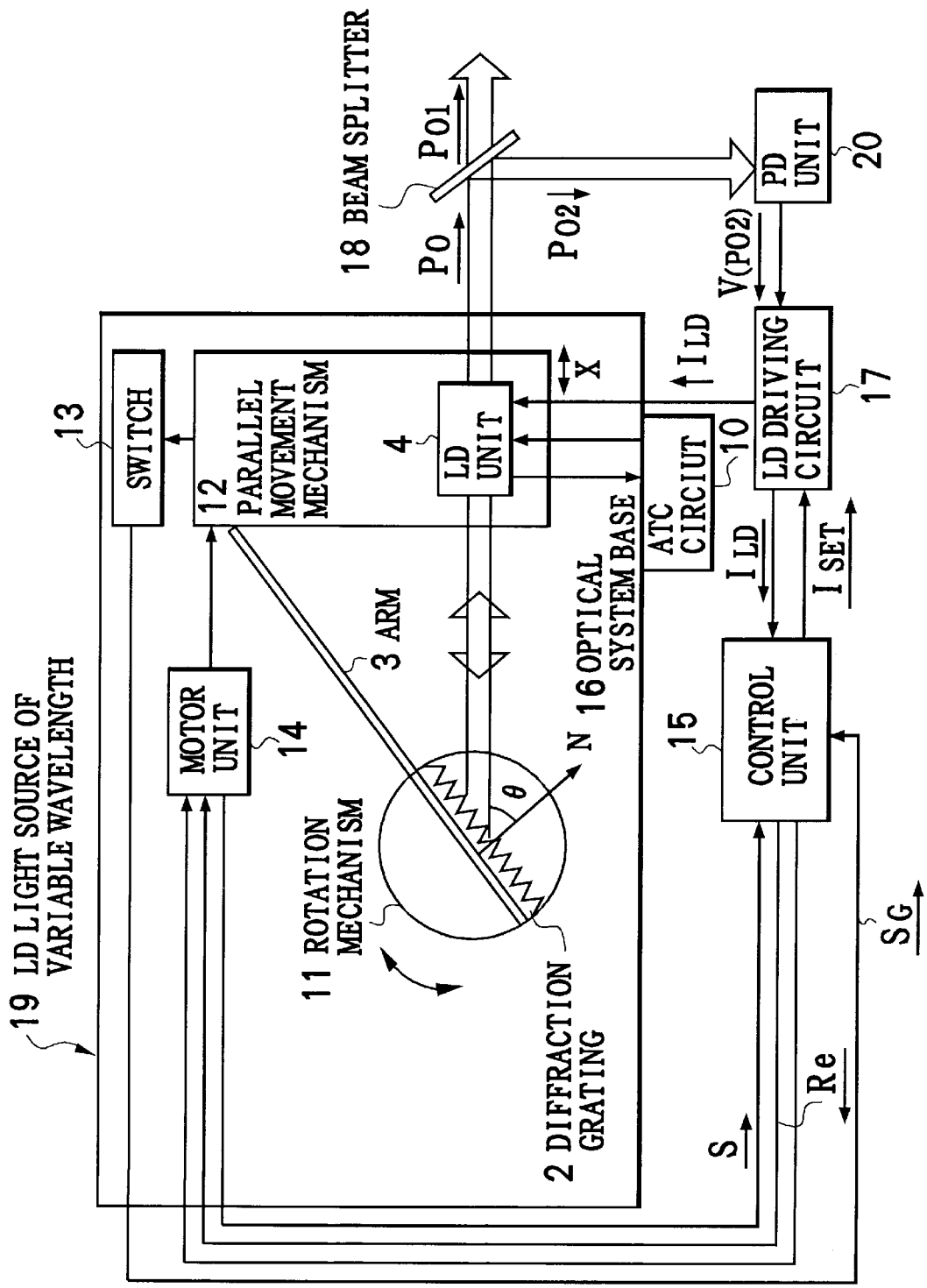
FIG. 10 is a block diagram showing an example of conventional external resonator type of variable-wavelength LD light source.
Figure 11:
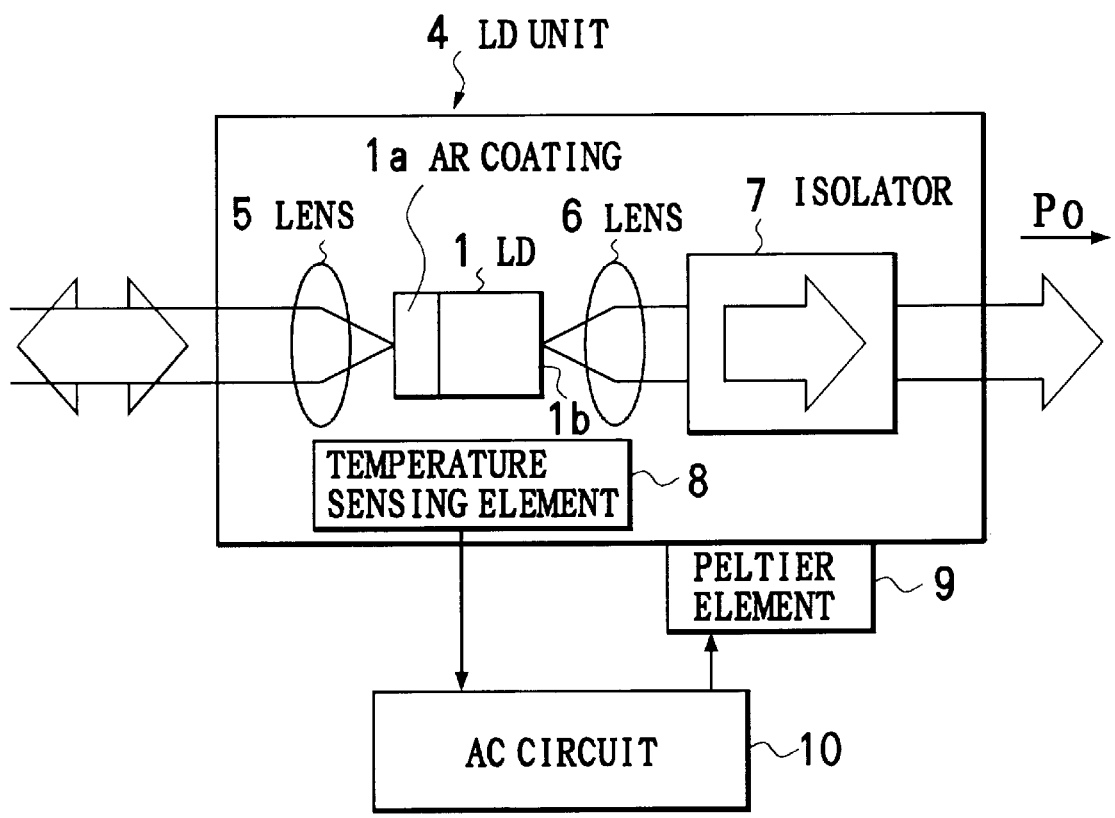
FIG. 11 is a view showing a construction of the LD unit.
Figure 12:
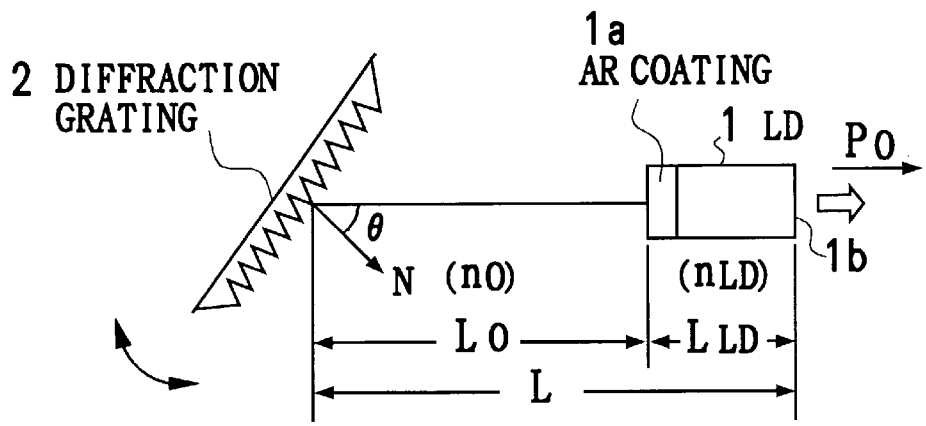
FIG. 12 is a view showing a partial construction of an external resonator type of variable-wavelength semiconductor LD source using a conventional diffraction grating.
Figure 13:
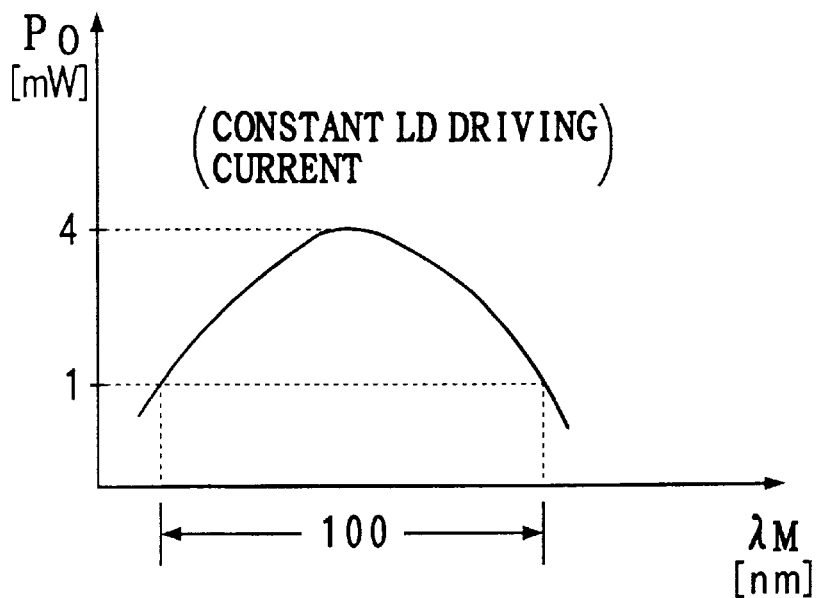
FIG. 13 is a graph showing the relationship between the wavelength and the optical output of a conventional external resonator type of variable-wavelength LD light source when the LD driving current is constant and the wavelength is variable.
Figure 14:
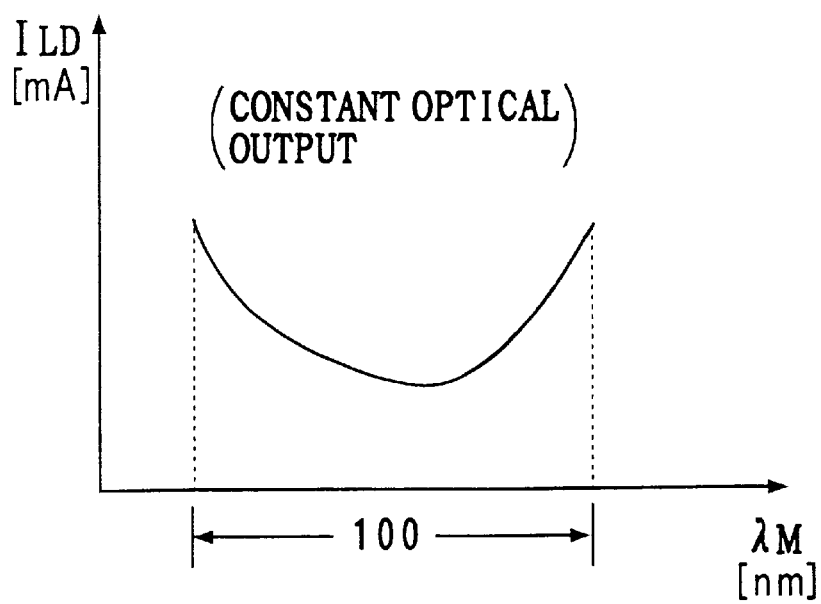
FIG. 14 is a graph showing the relationship between the wavelength and the driving current of a conventional external resonator type of variable-wavelength LD light source when the optical output is constant and the wavelength is variable.
Figure 15:
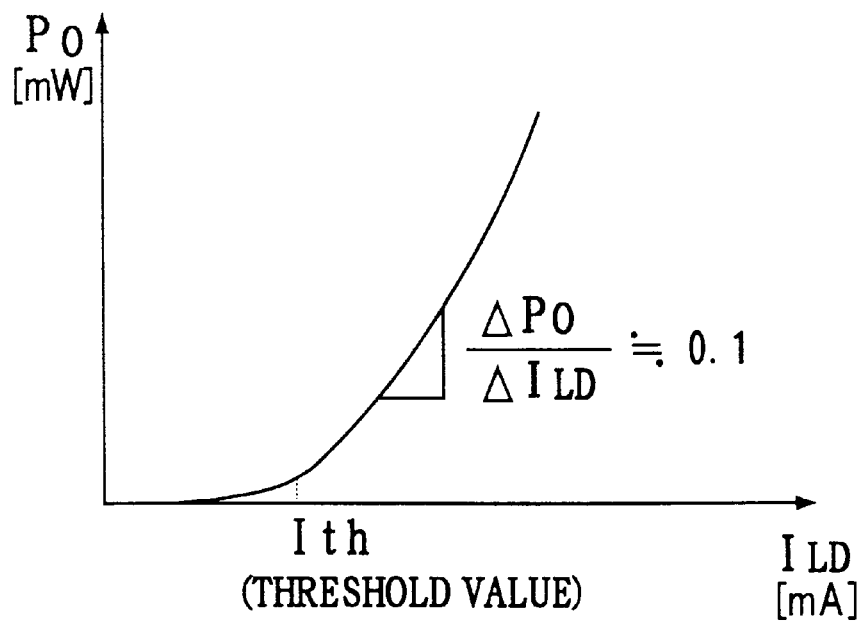
FIG. 15 is a graph showing the relationship between the driving current and the optical output of the LD in a conventional external resonator type of variable-wavelength LD light source.
Figure 16:
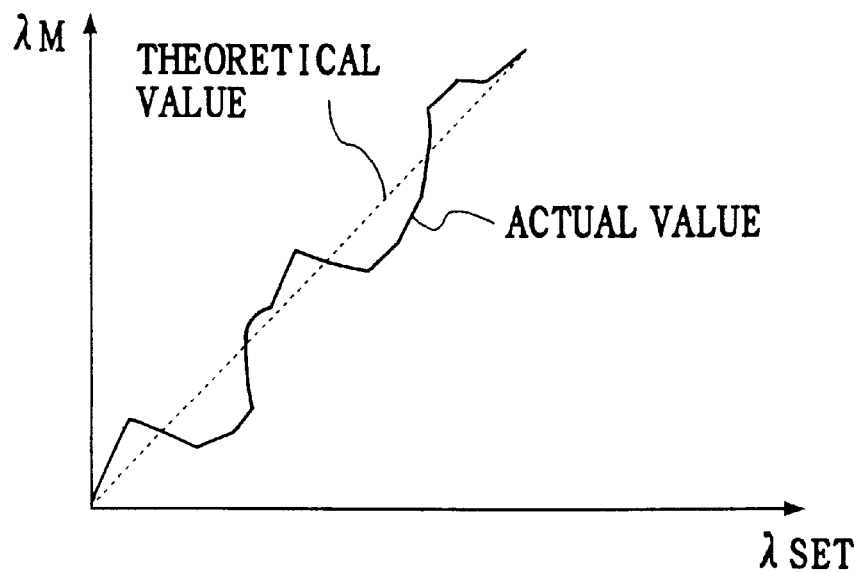
FIG. 16 is a graph showing the relationship between the set wavelength and the actual wavelength in a conventional external resonator type of variable-wavelength LD light source.

First of all, FIG. 1 shows an arrangement of an external resonator type variable-wavelength LD light source 21 in accordance with the first embodiment of the present invention. In FIG. 1, parts having the same functions as those in FIG. 10 are denoted by the same reference numerals, and explanation therefor is omitted.

In the first embodiment, as shown in FIG. 1, a temperature detecting element 25 and a storage unit 26 are newly provided.

More in detail, the temperature detecting element 25 as a means for detecting a temperature of the entire light source unit detects a temperature of the optical system base 14, that is, a temperature of the entire variable-wavelength LD light source unit 19 as a detected temperature $T_O$, and outputs the detected temperature to the control unit 15.

The storage unit 26 stores therein the temperature $T_O$ of the variable-wavelength LD light source unit 19, the LD driving current $I_{LD}$ and a wavelength compensation value based on the encoder output value S.

Explanation will next be made as to how to compensate the deterioration of the wavelength reproducibility caused by the errors of a change in the oscillation wavelength caused by a change in the LD driving current, a change in the oscillation wavelength caused by a change in the temperature of the entire variable-wavelength LD light source unit 19, a difference between the set and actual wavelengths caused by mechanical factors in FIG. 1.

Figures 2, 3:
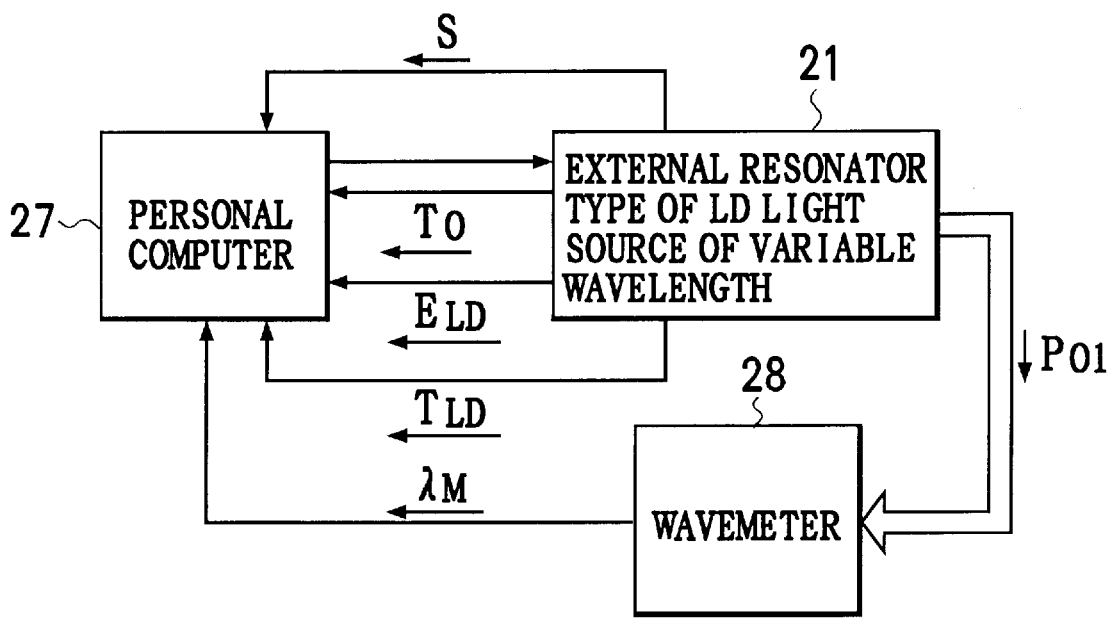
FIG. 2 is a block diagram showing a measurement system for making a translation table for compensating the change of oscillation wavelength.
FIG. 3 is a translation table which is stored in the storage unit in FIG. 1.

First, in such a measurement system having a personal computer 27 and a wavelength meter 28 as shown in FIG. 2, the oscillation wavelength is measured under conditions of the constant temperature and constant LD driving current to prepare such a conversion table as shown in FIG. 3, and then stored in the storage unit 26 in FIG. 1.

When the control unit 15 controls the motor of the motor unit 14 in such a manner that the encoder output S has a value corresponding to a set wavelength in the conversion table of FIG. 3, the error caused by the difference between the set and actual oscillation wavelengths resulting from the mechanical factors can be compensated.

If a wavelength setting resolution by the motor is 0.001 nm, then errors with respect to the oscillation wavelengths for the respective set wavelengths can be all suppressed to within 0.001 nm.

The control unit 15 reads the LD driving current LD driving current $I_{LD}$ and the temperature of $T_O$ of the entire variable-wavelength LD light source unit 19, and calculates a change $\Delta\lambda_M$ in the oscillation wavelength caused by the change of the LD driving current and by the change of the temperature of the entire variable-wavelength LD light source unit 19.

The change $\Delta\lambda_M$ of the oscillation wavelength is a value to be compensated.

The control unit 15 outputs the value $\Delta\lambda_M$ to be compensated to the variable-wavelength LD light source unit 19 to compensate the change of the oscillation wavelength.

In this case, since the errors resulting from the differences between the set and actual oscillation wavelengths caused by the mechanical factors are already corrected in the conversion table of the storage unit 26, $\Delta\lambda_M$ is expressed by an equation (11) which follows.

$$\Delta\lambda_m = (d\lambda_M/dI_{LD}) \times \Delta I_{LD} + (d\lambda_M/dT_O) \times \Delta T_O \qquad (11)$$

where, $\Delta I_{LD}$ is a change in the LD driving current, $\Delta T_O$ is a change in the temperature of the entire light source unit, $d\lambda_M/dI_{LD}$ is a rate of change of oscillation wavelength caused by the change of the LD driving current, and $d\lambda_M/dT_O$ is a rate of change of the oscillation wavelength caused by the change of the temperature of the entire light source unit.

A term $(d\lambda_M/dI_{LD}) \times \Delta I_{LD}$ in the equation (11) corresponds to the change of the oscillation wavelength caused by the change of the LD driving current, and a term $(d\lambda_M/dT_O) \times \Delta T_O$ corresponds to the change of the oscillation wavelength caused by the change of the temperature of the entire variable-wavelength LD light source unit 19.

As has been explained above, an oscillation wavelength change compensating means is formed for controlling the variable-wavelength LD light source unit 19 including the motor unit 14 under control of the control unit 15 on the basis of the stored information of the optical system base 14.

Second Embodiment

Explanation will next be made as to the second embodiment of the external resonator type variable-wavelength LD light source in accordance with the present invention.

Figure 4:
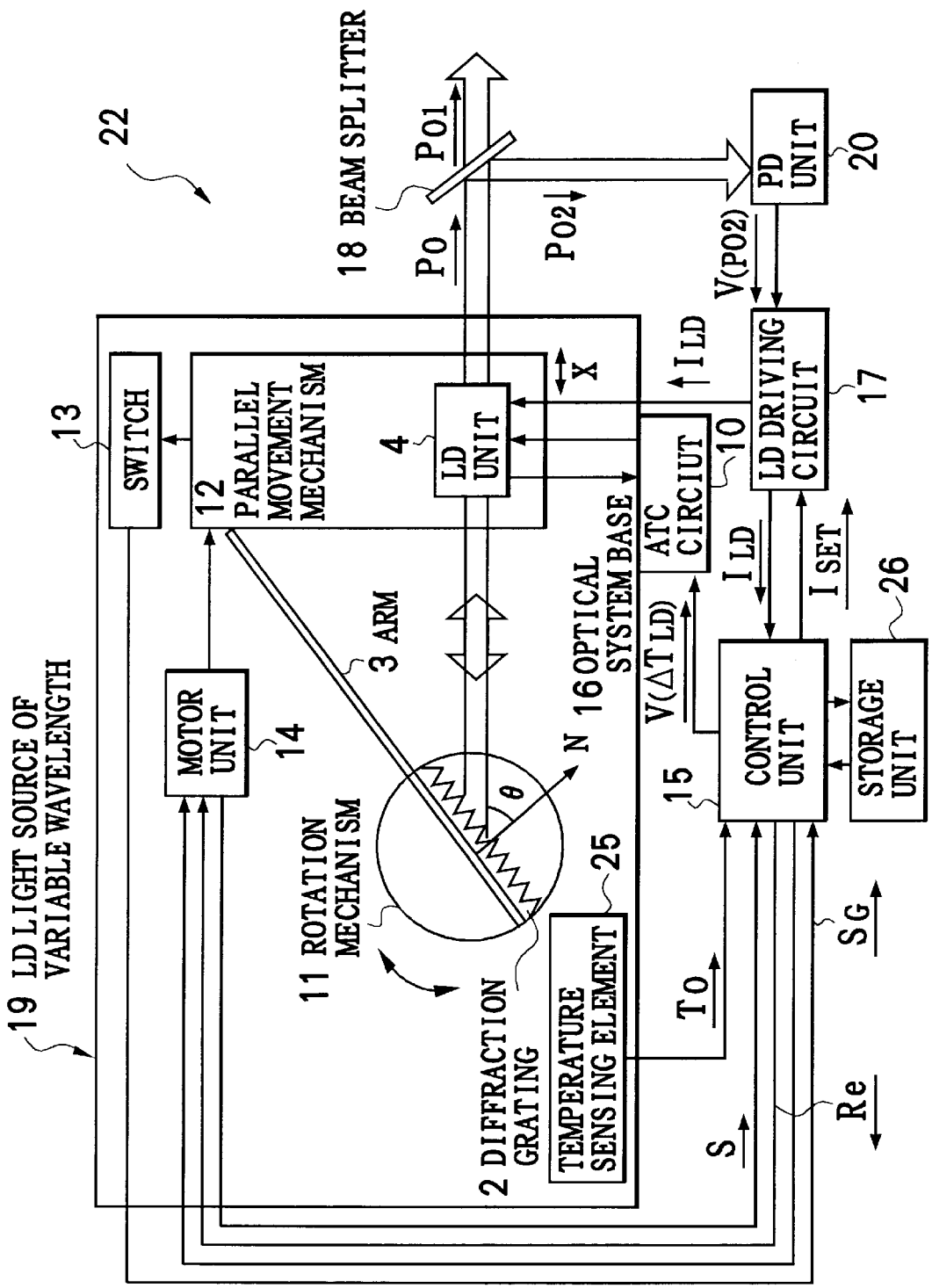
FIG. 4 is a block diagram showing an external resonator type of variable-wavelength LD light source according to a second embodiment of the present invention.

Shown in FIG. 4 is an arrangement of an external resonator type variable-wavelength LD light source unit 22 in accordance with the second embodiment of the present invention. In FIG. 4, parts having the same functions as those in the first embodiment of FIG. 1 are denoted by the same reference numerals, and explanation thereof is omitted.

Explanation will next be made as to a specific means for compensating the deterioration of the wavelength reproducibility caused by the errors of a change in the oscillation wavelength caused by a change in the LD driving current, a change in the oscillation wavelength caused by a change in the temperature of the entire variable-wavelength LD light source unit 19, a difference between the set and actual wavelengths caused by mechanical factors in FIG. 4.

When assuming first that the errors caused by the differences between the set and actual oscillation wavelengths caused by the mechanical factors are already corrected in the conversion table of the storage unit 26, the control unit 15 reads the LD driving current LD driving current $I_{LD}$ and the temperature of $T_O$ of the entire variable-wavelength LD light source unit 19, and calculates a change $\Delta\lambda_M$ in the oscillation wavelength.

Next, the controller calculates a value $\Delta T_{LD}$ for compensation of the change $\Delta\lambda_M$ of the oscillation wavelength and outputs $V(\Delta T_{LD})$ corresponding to a voltage conversion thereof to the ATC circuit 10. As a result, since the temperature of the LD 1 can be compensated through the ATC circuit 10 to compensate the refractive index of the LD 1, the change of the oscillation wavelength can be compensated.

When the aforementioned equations (8) and (11) are considered, the following relationship is satisfied.

$$\Delta\lambda_M = (d\lambda_M/dI_{LD}) \times \Delta I_{LD} + (n_O \times \alpha \times L_O \times \lambda_M/L) \times \Delta T_O \qquad (12)$$

where, $\alpha$ is a thermal expansion coefficient of the optical system base.

In actual situations, in such a measurement system as shown in FIG. 2, $d\lambda_M/dI_{LD}$ in the equation (12) is previously calculated by stopping the motor and measuring the LD driving current $I_{LD}$ and the oscillation wavelength $\lambda_M$ with the constant LD driving current.

The term $(n_O \times \alpha \times L_O \times \lambda_M/L)$ in the equation (12) corresponds to the term $d\lambda_M/dI_O$ in the equation (11), and is previously calculated, in such a measurement system as shown in FIG. 2, by stopping the motor and measuring the $T_O$ of the entire variable-wavelength LD light source unit 19 and the oscillation wavelength $\lambda_M$ with the constant LD driving current.

Assuming that a change in the oscillation wavelength caused by a change in the refractive index of the LD is denoted by $\Delta\lambda_M(n_{LD})$, then the following equation is satisfied.

$$\Delta\lambda_M(n_{LD}) = (dn_{LD}/dT_{LD}) \times \Delta T_{LD} \times L_{LD} \times \lambda_M/(n_O \times L_O + n_{LD} \times L_{LD}) \quad (13)$$

where, $\Delta n_{LD}$ is a compensation of the refractive index of the LD, $\Delta T_{LD}$ is a compensation of the temperature of the LD, and $dn_{LD}/dT_{LD}$ is a change in the refractive index of the LD caused by the change of the LD temperature.

That is, since the change of the oscillation wavelength is corrected by changing the temperature of the LD1, this can be realized by finding such $\Delta T_{LD}$ as to make equal the right sides of the equations (12) and (13).

In practice, in such a measurement system as shown in FIG. 2 in the first embodiment, the temperature of the entire variable-wavelength LD light source unit 19 is made constant, the LD driving current is made constant and the motor of the motor unit 14 is stopped, $\Delta T_{LD}$ and $\Delta\lambda_M(n_{LD})$ are actually measured to prepare such a conversion table as shown in FIG. 5, and stored in the storage unit 26 of FIG. 4, and then compensation is made based on the conversion table of FIG. 5.

Assuming now that, with respect to the compensation accuracy, $\lambda_M = 1550$ nm and $n_{LD} = 3.54$, then $dn_{LD}/dT_{LD} \approx 0.23 \times 10^{-3}$. When L=30 mm, $L_{LD}=300$ $\mu$m and $n_O=1$; the above equation (13) is rewritten as follows.

$$\Delta\lambda_M(n_{LD}) = 3.5 \times 10^{-12} \times \Delta T_{LD} \quad (14)$$

That is, by controlling the ATC circuit 10 in FIG. 4 with a resolution of 0.1° C., the change of the oscillation wavelength can be compensated with an accuracy of about 0.3 pm in accordance with the equation (14).

By the above-mentioned method, even when the LD driving current or operational temperature varies, a wavelength reproducibility of 0.001 nm can be ensured.

As has been mentioned above, an oscillation wavelength change compensating means is formed for controlling the ATC circuit 10 under control of the control unit 15 based on the stored information of the storage unit 26 to thereby change the temperature of the LD unit 4.

Third Embodiment

Explanation will then be made as to the third embodiment of the external resonator type variable-wavelength LD light source in accordance with the present invention.

Figure 6:
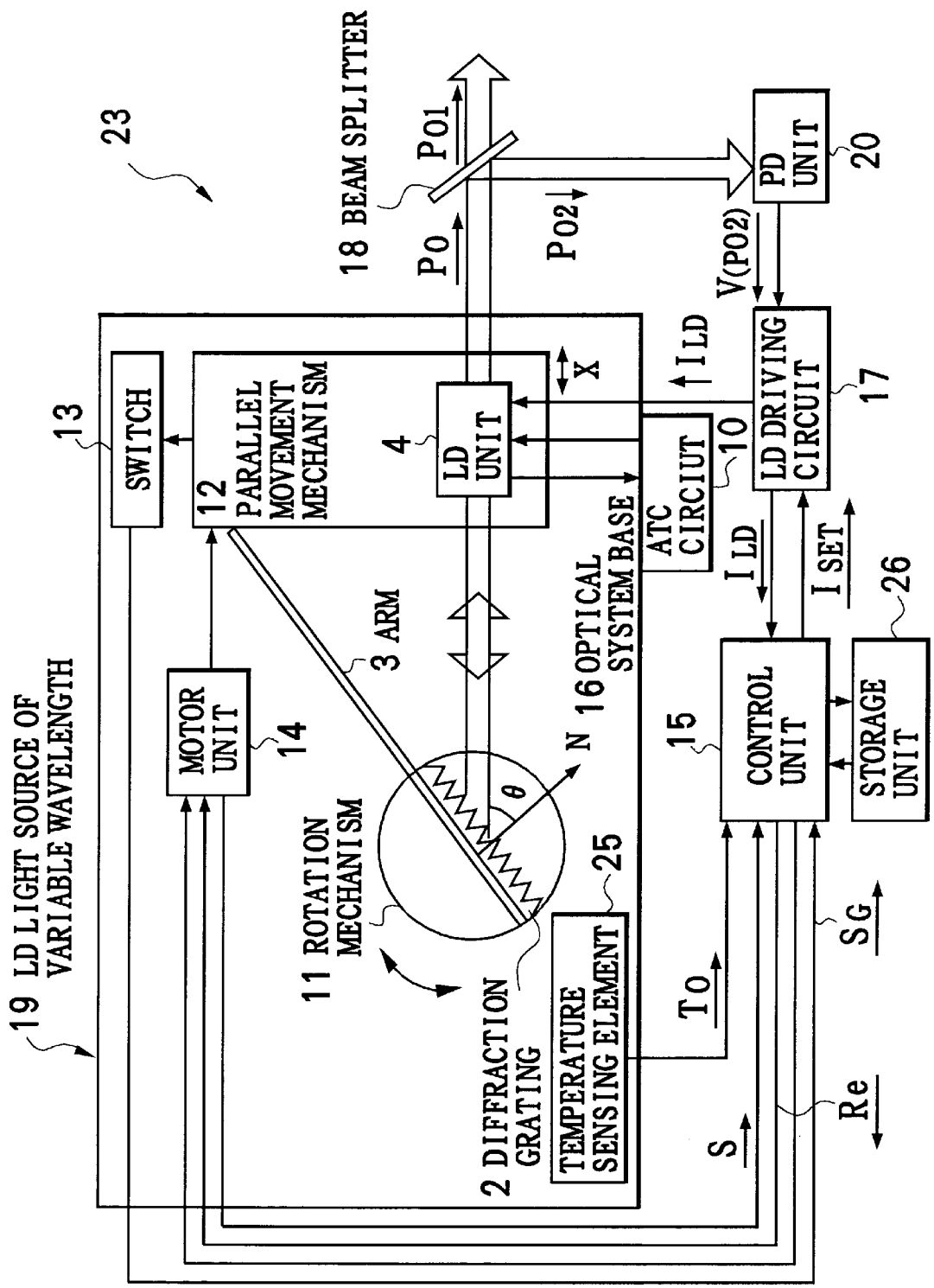
FIG. 6 is a block diagram showing an external resonator type of variable-wavelength LD light source according to a third embodiment of the present invention.

FIG. 6 shows an arrangement of an external resonator type variable-wavelength LD light source unit 23 in the third embodiment of the present invention. In FIG. 6, parts having the same functions as those in the first embodiment of FIG. 1 are denoted by the same reference numerals, and explanation thereof is omitted.

Explanation will next be made as to a specific means for compensating the deterioration of the wavelength reproducibility caused by the errors of a change in the oscillation wavelength caused by a change in the LD driving current, a change in the oscillation wavelength caused by a change in the temperature of the entire variable-wavelength LD light source unit 19, a difference between the set and actual wavelengths caused by mechanical factors in FIG. 6.

When assuming first that the errors caused by the differences between the set and actual oscillation wavelengths caused by the mechanical factors are already corrected in the conversion table of the storage unit 26, the control unit 15 reads the LD driving current LD driving current $I_{LD}$ and the temperature of $T_O$ of the entire variable-wavelength LD light source unit 19, and calculates a change $\Delta\lambda_M$ in the oscillation wavelength.

Next, the parallel moving mechanism 12 is finely moved by the motor of the motor unit 14, and the motor is controlled so that the encoder output value becomes $S+\Delta\lambda_M/(d\lambda_M/dS)$ to compensate the change of the oscillation wavelength.

Where, $d\lambda_M/dS$ is a rate of change of the oscillation wavelength caused by a change of the encoder output value. With respect to the compensation accuracy, when the resolution of the wavelength setting by the motor of the motor unit 14 in FIG. 6 is 0.001 nm, the change of the oscillation wavelength can be compensated with an accuracy of 0.001 nm.

By the above-mentioned compensating method, even when the LD driving current or operational temperature varies, a wavelength reproducibility of 0.001 nm can be ensured.

As mentioned above, an oscillation wavelength change compensating means is formed for controlling the parallel moving mechanism 12 based on the motor under control of the control unit 15 based on the stored information of the storage unit 26.

Fourth Embodiment

Explanation will next be made as to the fourth embodiment of the external resonator type variable-wavelength LD light source in accordance with the present invention.

Figure 7:
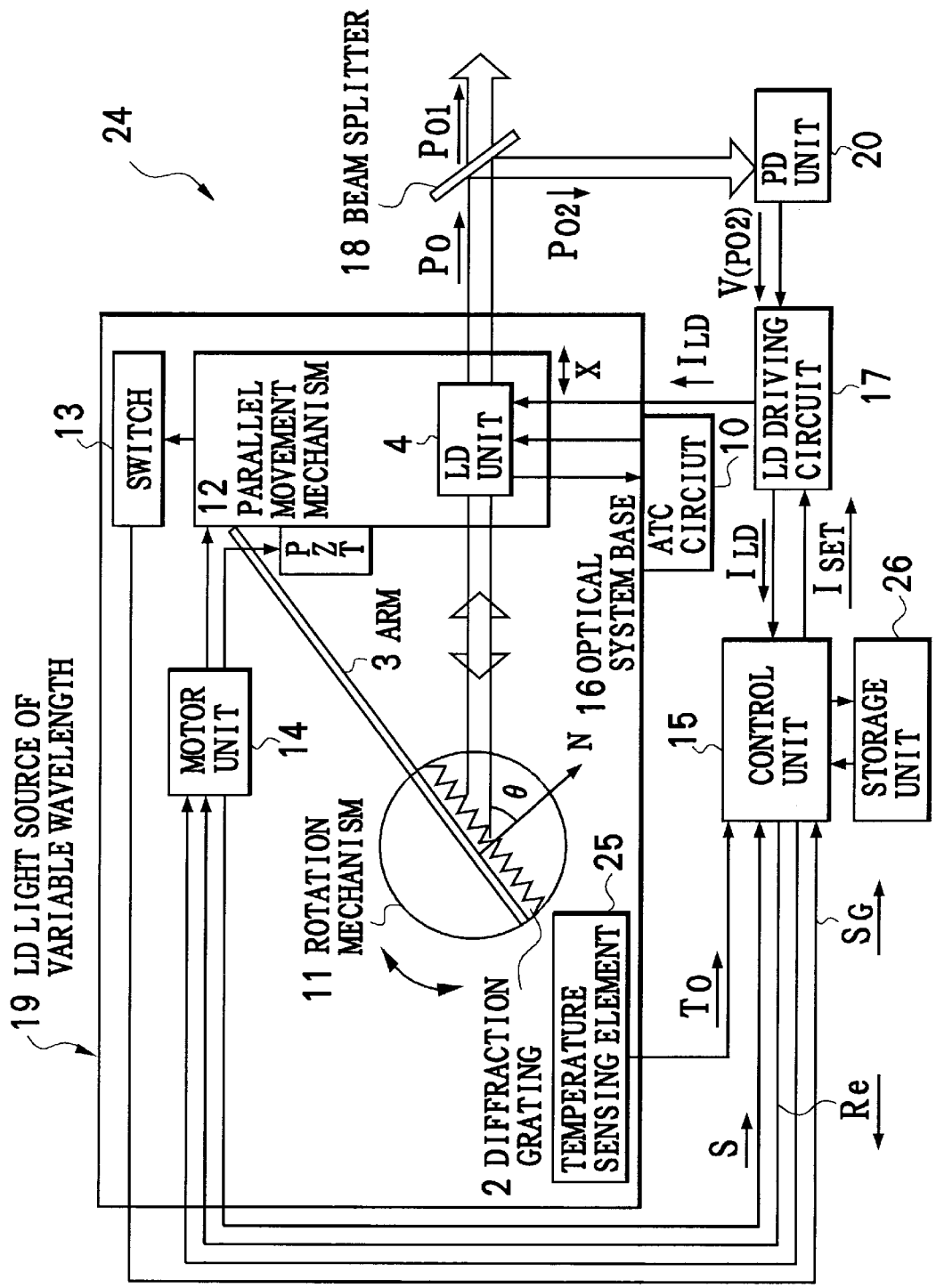
FIG. 7 is a block diagram showing an external resonator type of variable-wavelength LD light source according to a fourth embodiment of the present invention.

FIG. 7 shows an arrangement of an external resonator type variable-wavelength LD light source unit 24 in accordance with the fourth embodiment of the present invention. In FIG. 7, parts having the same functions as those in the first embodiment of FIG. 1 are denoted by the same reference numerals, and explanation thereof is omitted.

First, in the fourth embodiment, a PZT 29 is newly provided as shown in FIG. 7. The PZT 29 can finely move the parallel moving mechanism 12.

Explanation will next be made as to a specific means for compensating the deterioration of the wavelength reproducibility caused by the errors of a change in the oscillation wavelength caused by a change in the LD driving current, a change in the oscillation wavelength caused by a change in the temperature of the entire variable-wavelength LD light source unit 19, a difference between the set and actual wavelengths caused by mechanical factors in FIG. 7.

When assuming first that the errors caused by the differences between the set and actual oscillation wavelengths caused by the mechanical factors are already corrected in the conversion table of the storage unit 26, the control unit 15 reads the LD driving current LD driving current $I_{LD}$ and the temperature of $T_O$ of the entire variable-wavelength LD light source unit 19, and calculates a change $\Delta\lambda_M$ in the oscillation wavelength.

Next, the control unit 15 calculates a value $\Delta L_{PZT}$ for compensation of the change $\Delta\lambda_M$ of the oscillation wavelength in accordance with the equation (8), controls the motor the motor unit 14, and finely moves the parallel moving mechanism 12 through the PZT 29 to compensate the change of the oscillation wavelength. In this case, $\Delta\lambda_M$ is expressed by the equation (12) as in FIG. 6 of the third embodiment.

When the a change in the oscillation wavelength caused by the compensation of $L_O$ of the above means is denoted $\Delta\lambda_M(L_{PZT})$, the following relationship is satisfied.

$$\Delta\lambda_M(L_{PZT}) = (n_O \times \Delta L_{PZT}) \times \lambda_M/(n_O \times L_O \times n_{LD} \times L_{LD}) \quad (17)$$

where, $\Delta L_{PZT}$ is a compensation of $L_O$ by PZT.

Therefore, this can be realized by finding such a $\Delta L_{PZT}$ as to make equal the right sides of the equations (12) and (17).

Figures 8, 9:
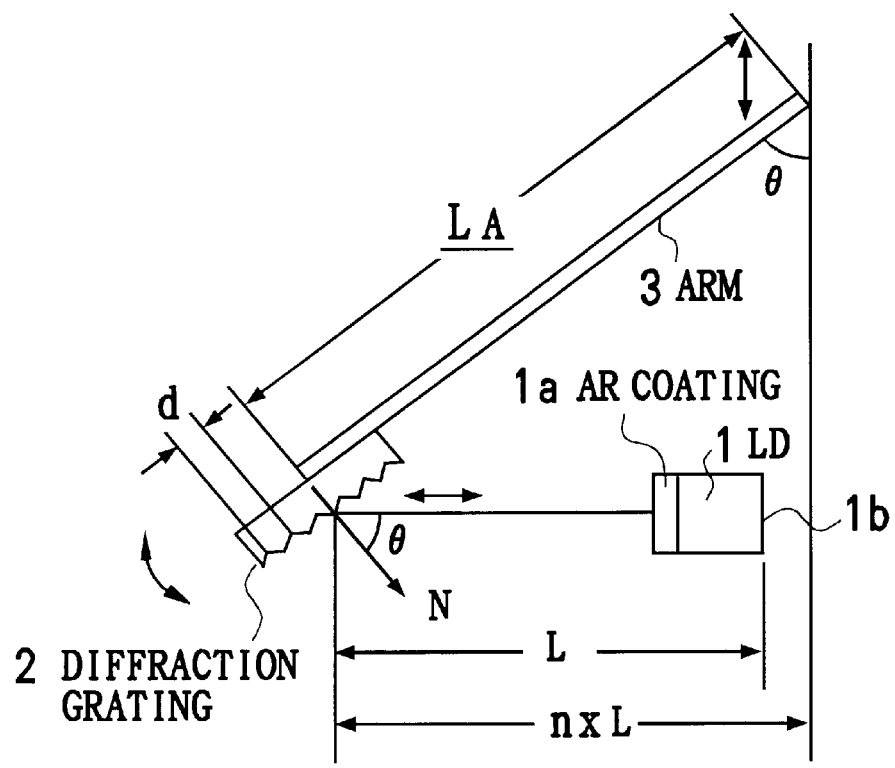
FIG. 8 is a translation table which is stored in the storage unit in FIG. 7.
FIG. 9 is an explanation view of an external resonator type of variable-wavelength semiconductor LD source using a sine bar mechanism.

In practice, in such a measurement system as shown in FIG. 2, the temperature of the entire variable-wavelength LD light source unit 19 is made constant and the LD driving current is made constant, $\Delta L_{PZT}$ and $\Delta\lambda_M(L_{PZT})$ are actually measured to prepare such a conversion table as shown in FIG. 8, and stored in the storage unit 26 of FIG. 7, and then compensation is made based on the conversion table of FIG. 8.

Assuming now that, with respect to the compensation accuracy, $\lambda_M=1550$ nm, L=30 mm, $L_{LD}=300$ μm, $n_O=1$ and $n_{LD}=3.54$; then the above equation (17) is rewritten as follows.

$$\Delta\lambda_M(L_{PZT}) \approx 5 \times 10^{-5} \times \Delta L_{PZT} \tag{18}$$

That is, when the PZT 29 in FIG. 7 has a resolution of 10 nm/100 mV, the change of the oscillation wavelength can be compensated with an accuracy of about 0.5 pm.

By the aforementioned method, even when the LD driving current or operational temperature varies, a wavelength reproducibility of 0.001 nm can be ensured.

As mentioned above, an oscillation wavelength change compensating means is formed for controlling the parallel moving mechanism 12 based on the motor through the PZT 29 under control of the control unit 15 on the basis of the stored information of the storage unit 26.

Although the switch has been used as the position detecting means in the foregoing respective embodiments, the present invention is not limited to the specific example, but any means may be uses so long as it has a position detecting function.

Further, with respect to detailed parts of other structures, the structures may be suitably modified, as a matter of course.

As has been explained in the foregoing, since the external resonator type variable-wavelength LD light source of the invention can be operated with a constant optical output, can change the LD driving current, and can previously measure the change of the oscillation wavelength caused by the change of the LD driving current, the change of the oscillation wavelength caused by the change of the temperature of the entire light source unit, and the difference between the set and actual wavelengths caused by mechanical factors, and can store them in the form of corrected values to correspondingly correct the set wavelength even when the LD driving current or operational temperature varies, the light source can ensure a wavelength reproducibility of 0.001 nm, can vary the wavelength continuously, and can make its costs low and its size small.

According to the external resonator type variable-wavelength LD light source having an oscillation wavelength change compensation member which controls the ATC circuit under control of the controller to thereby change the temperature of the LD unit and to compensate the change of the oscillation wavelength of the variable-wavelength LD light source unit, the external resonator type variable-wavelength LD light source can compensate errors of the change in the oscillation wavelength caused by the change in the LD driving current, the change in the oscillation wavelength caused by the change in the temperature of the entire light source unit, and a difference between the set and actual wavelengths caused by mechanical factors to thereby ensure a wavelength reproducibility of, e.g., 0.001 nm even when the LD driving current or operational temperature varies, can vary the wavelength continuously, and can make its costs low and its size small.

According to the external resonator type variable-wavelength LD light source having an oscillation wavelength change compensation member which controls driving of the motor under control of a controller to thereby move the parallel moving mechanism finely and to compensate the change of the oscillation wavelength of the variable-wavelength LD light source unit, the external resonator type variable-wavelength LD light source can compensate errors of the change in the oscillation wavelength caused by the change in the LD driving current, the change in the oscillation wavelength caused by the change in the temperature of the entire light source unit, a difference between the set and actual wavelengths caused by mechanical factors, can ensure a wavelength reproducibility of 0.001 nm even when the LD driving current or operational temperature varies, can vary the wavelength continuously, and can make its costs low and its size small.

According to the external resonator type variable-wavelength LD light source which further comprises the PZT for finely moving the parallel moving mechanism by driving the motor, and in that the oscillation wavelength change compensation member controls driving of the motor under control of the controller to drive the PZT and to move the parallel moving mechanism finely to thereby correct the change of the oscillation wavelength of the variable-wavelength LD light source unit, the external resonator type variable-wavelength LD light source can compensate, errors of the change in the oscillation wavelength caused by the change in the LD driving current, the change in the oscillation wavelength caused by the change in the temperature of the entire light source unit, a difference between the set and actual wavelengths caused by mechanical factors, can ensure a wavelength reproducibility of 0.001 nm even when the LD driving current or operational temperature varies, can vary the wavelength continuously, and can make its costs low and its size small.

What is claimed is:

1. An external resonator type variable-wavelength semiconductor laser light source comprising:

a light source unit temperature detection member for detecting a temperature of an entire semiconductor laser light source unit;

a storage unit for storing therein oscillation wavelength changes of the semiconductor laser light source unit on the basis of a change in a driving current to the semiconductor laser, of a change in the temperature of the entire semiconductor laser light source unit detected by the light source unit temperature detection member, and of a change in an encoder output value measured by an encoder; and a wavelength change compensation member for compensating a change of the oscillation wavelength of the semiconductor laser light source unit on the basis of the oscillation wavelength changes stored in the storage unit.

2. An external resonator type variable-wavelength semiconductor laser light source comprising:

a semiconductor laser unit including a semiconductor laser having a non-reflection film applied on its one end face, a temperature detecting element for measuring a temperature of the semiconductor laser and a Peltier element for changing the temperature of the semiconductor laser;

a diffraction grating for forming a resonator together with the other end face of the semiconductor laser of the semiconductor laser unit having the non-reflection film not applied thereon;

a sine bar mechanism having the diffraction grating mounted thereto for changing an incident angle of light emitted from the semiconductor laser to the diffraction grating;

a parallel moving mechanism having the semiconductor laser unit mounted thereon and provided as contacted with the sine bar;

a driver unit having a motor for finely driving the parallel moving mechanism and an encoder for measuring rotation of the motor;

a position detecting member for detecting a position of the parallel moving mechanism;

a temperature adjustment circuit for controlling a temperature of the semiconductor laser unit; an d a semiconductor laser driving circuit for driving the semiconductor laser;

a light source unit temperature detection member for detecting a temperature of an entire light source unit, the light source unit including the semiconductor laser unit, diffraction grating, sine bar mechanism, parallel moving mechanism, driver unit, and position detecting member;

a storage unit for storing therein oscillation wavelength changes of the semiconductor laser light source unit on the basis of a change in a driving current to the semiconductor laser, of a change in the temperature of the entire semiconductor laser light source unit detected by the light source unit temperature detection member, and of a change in an encoder output value measured by an encoder; and a wavelength change compensation member for compensating a change of the oscillation wavelength of the semiconductor laser light source unit on the basis of the oscillation wavelength changes stored in the storage unit.

3. An external resonator type variable-wavelength semiconductor laser light source as set forth in claim 2, wherein the oscillation wavelength change compensation member controls the temperature adjustment circuit under control of a controller to thereby change the temperature of the semiconductor laser unit.

4. An external resonator type variable-wavelength semiconductor laser light source as set forth in claim 2, wherein the oscillation wavelength change compensation member controls driving of the motor under control of a controller to thereby move the parallel moving mechanism finely.

5. An external resonator type variable-wavelength semiconductor laser light source as set forth in claim 2, further comprising a piezo element for finely moving the parallel moving mechanism by driving the motor, and in that the oscillation wavelength change compensation member controls driving of the motor under control of a controller to drive the piezo element and to move the parallel moving mechanism finely.

\* \* \* \* \*